(12) United States Patent
Lai

(10) Patent No.: US 7,588,975 B2
(45) Date of Patent: Sep. 15, 2009

(54) METHOD OF MANUFACTURING PIXEL STRUCTURE

(75) Inventor: Han-Chung Lai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 452 days.

(21) Appl. No.: 11/620,719

(22) Filed: Jan. 7, 2007

(65) Prior Publication Data

US 2007/0111418 A1 May 17, 2007

Related U.S. Application Data

(62) Division of application No. 10/905,764, filed on Jan. 20, 2005, now Pat. No. 7,180,139.

(30) Foreign Application Priority Data

Nov. 18, 2004 (TW) .............................. 93135392 A

(51) Int. Cl.
*H01L 21/84* (2006.01)
(52) U.S. Cl. ................. 438/159; 257/E21.414
(58) Field of Classification Search ................. 438/159; 257/E21.414
See application file for complete search history.

(56) References Cited

U.S. PATENT DOCUMENTS

| 5,243,202 A | * | 9/1993 | Mori et al. ........... 257/E21.414 |
| 5,498,573 A | * | 3/1996 | Whetten ..................... 438/644 |
| 6,362,028 B1 | * | 3/2002 | Chen et al. ................. 438/159 |

* cited by examiner

*Primary Examiner*—Chandra Chaudhari
(74) *Attorney, Agent, or Firm*—Jianq Chyun IP Office

(57) ABSTRACT

A method of manufacturing a pixel structure controlled by a data line and a scan line is provided. A gate electrode electrically coupled to the scan line is formed on a substrate and a first dielectric layer covering the scan line and the gate electrode is formed. A first and a second semiconductor layer are formed on the dielectric layer and a source/drain and a patterned conductor layer are formed. A second dielectric layer is formed on the substrate to cover the data line, the resistance line and the source/drain. A first pixel electrode and a second pixel electrode are formed on the second dielectric layer and these two pixel electrodes are separated from each other; wherein the first pixel electrode is electrically connected to one of the source/drain while the second pixel electrode is electrically connected to another of the source/drain through the resistance wire.

7 Claims, 3 Drawing Sheets

METHOD OF MANUFACTURING PIXEL STRUCTURE

CROSS-REFERENCE TO RELATED APPLICATION

This is a divisional application of patent application Ser. No. 10/905,764, filed on Jan. 20, 2005, which claims the priority benefit of Taiwan patent application serial no. 93135392, filed on Nov. 18, 2004 and is now allowed. The entirety of each of the above-mentioned patent applications is hereby incorporated by reference herein and made a part of this specification.

BACKGROUND OF THE INVENTION

1. Field of the Invention

The present invention generally relates to and a method of manufacturing a pixel structure of a liquid crystal display (LCD). More particularly, the present invention relates to and a method of manufacturing a pixel structure applicable to a multi-domain vertically alignment LCD.

2. Description of Related Art

Since the demand of displays is drastically increasing, the industry have devoted full efforts to develop display devices and their associated products. Among these display devices, a cathode ray tube (CRT) had occupied the market for a long time because it had excellent display quality and technology maturity. However, the larger power consumption and the higher radiation features of the CRT contradict to the green environment concept. In addition, to further minimize the occupied space of a CRT is limited. As a result, the CRT can not meet the market trend of a lightweight, thin, short, compact, appealing and low-power consumption product. Accordingly, a thin film transistor liquid crystal display (TFT-LCD) having the features of high image quality, optimal space efficiency and low power consumption has become a mainstream in the market.

Currently, the performance requirements of the LCD in the market are directed to high contrast ratio, no gray scale inversion, little color shift, high luminance, high color abundance, high color saturation, quick response and wide viewing angle features. Nowadays, various technologies that accomplish the requirements of wide viewing angle are, for example, twisted nematic liquid crystal added with a wide viewing angle film, in-plane switching (IPS) LCDs, fringe field switching LCDs and multi-domain vertically alignment (MVA) thin film transistor LCDs, etc.

In regard to the conventional MVA thin film transistor LCDs, since the alignment protrusions disposed on a color filter substrate or a thin film transistor array substrate cause the liquid molecules to display a multi-directional arrangement, the MVA thin film transistor LCDs can provide a wide viewing angle. It is noticeable that the transmittance-level curve of the MVA LCDs has different curvatures as the viewing angle varies. In other words, when the viewing angle is changed, the brightness of the MVA LCDs will vary, which further results in color shift and color saturation insufficiency.

SUMMARY OF THE INVENTION

Accordingly, the present invention is directed to a pixel structure, wherein pixel electrodes and thin film transistors have different voltages to improve color shift and color saturation insufficiency.

In addition, the present invention is further directed to a method for fabricating a pixel structure to improve transmittance variation as the viewing angle varies.

Based on the objective described above and other objectives, the invention provides a pixel structure controlled by a scan line and a data line on a substrate. The pixel structure comprises a thin film transistor, a resistance wire, a first pixel electrode, and a second pixel electrode, which are disposed on the substrate. Additionally, the thin film transistor is electrically coupled to the scan line, the data line, and the resistance wire. Further, the first pixel electrode is electrically connected to the thin film transistor and the second pixel electrode is electrically connected to the thin film transistor through the resistance wire.

According to the preferred embodiment of the invention, said thin film transistor comprises a gate electrode, a first dielectric layer, a first semiconductor layer, a source/drain and a second dielectric layer, wherein the gate electrode is electrically coupled to the scan line. In addition, the first dielectric layer is deposited over the gate electrode and the first semiconductor layer is deposited on the first dielectric layer covering the gate electrode. Furthermore, the source/drain is deposited on the first semiconductor layer, wherein one of the source/drain is electrically coupled to the data line while another of the source/drain is electrically connected to the resistance line and the first pixel electrode, respectively. Besides, the second dielectric layer is deposited on the first dielectric layer and covers the source/drain.

According to an embodiment of the invention, the resistance wire comprises a second semiconductor layer and a patterned conductor layer, wherein the second semiconductor layer connects between one of source/drain and the second pixel electrode due to the patterned conductor layer. In addition, the first semiconductor layer and the second semiconductor layer are, for example, comprised of substantially the same material. More, the thickness of the second semiconductor layer is lesser than or equal to that of the first semiconductor layer.

According to an embodiment of the invention, said second semiconductor layer comprises at least one island pattern. In addition, the thickness of the island patter is lesser than or equal to that of the first semiconductor layer.

According to an embodiment of the invention, the second dielectric layer has a first contact hole, wherein the first pixel electrode is electrically connected to one of the source/drain through the first contact hole.

According to an embodiment of the invention, the second dielectric layer has a second contact hole, wherein the second pixel electrode is electrically connected to the resistance wire through the second contact hole.

According to an embodiment of the invention, the first semiconductor layer comprises a channel layer and an ohmic contact layer, wherein the ohmic contact layer is disposed between the channel layer and the source/drain.

Based on the objectives described above and other objectives, a method for manufacturing a pixel electrode of the invention is adapted to forming a pixel structure on a substrate, wherein the pixel structure is controlled by the scan line and the data line. The manufacturing method for the pixel structure comprises the following steps. First, a gate electrode electrically coupled to the scan line is formed on a substrate and a first dielectric layer covering the scan line and the gate electrode is then formed on the substrate. Subsequently, a first and a second semiconductor layer are formed on the dielectric layer and a source/drain and a patterned conductor layer are formed on the substrate, wherein one of the source/drain is electrically coupled to the data line while another is electrically connected to the second semiconductor through the patterned conductor layer. A second dielectric layer is formed on the substrate to cover the data line, the resistance line and the source/drain. Thereafter, a first pixel electrode and a second pixel electrode are formed on the second dielectric layer and these two pixel electrodes are separated from each other; wherein the first pixel electrode is electrically connected to one of the source/drain while the second pixel electrode is electrically connected to another of the source/drain through the resistance wire.

According to the embodiment of the invention, the step of forming the source/drain further comprises removing a partial thickness of the second semiconductor layer.

According to the embodiment of the invention, the step of forming the second semiconductor layer comprises forming at least one island pattern. In addition, the step of forming the data line further comprises removing a partial thickness of these island patterns.

According to the embodiment of the invention, the step of after forming the second dielectric layer and before forming the first and the second pixel electrodes further comprises forming a first contact hole in the second dielectric layer, wherein the first contact hole exposes partially the surface of one of the source/drain. After the first and the second pixel electrodes are formed on the second dielectric layer, the first pixel electrode is electrically connected to the source/drain through the first contact hole.

According to the embodiment of the invention, the step of after forming the second dielectric layer and before forming the first and the second pixel electrodes further comprises forming a second contact hole in the second dielectric layer, wherein the second contact hole exposes partially the surface of the patterned conductor layer. After the first and the second pixel electrodes are formed on the second dielectric layer, the second pixel electrode is electrically connected to the patterned conductor layer through the second contact hole.

According to the preferred embodiment of the invention, the step of forming the semiconductor layer comprises forming a channel layer on the first dielectric layer and forming an ohmic contact layer on the channel layer.

Based on above description, since the pixel structures of the invention employ the resistance wire to connect the second pixel electrode and the thin film transistor, the first and the second pixel electrodes have different voltages to improve colour shift and brightness variation caused by viewing angle variation. In addition, the invention integrates the process of forming the resistance wire into the process the pixel structures so that the manufacturing method of pixel structures of the invention not only has no need to add an extra mask but forms pixel electrodes with different voltages in a single pixel structure.

The objectives, other features and advantages of the invention will become more apparent and easily understood from the following detailed description of the invention when taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
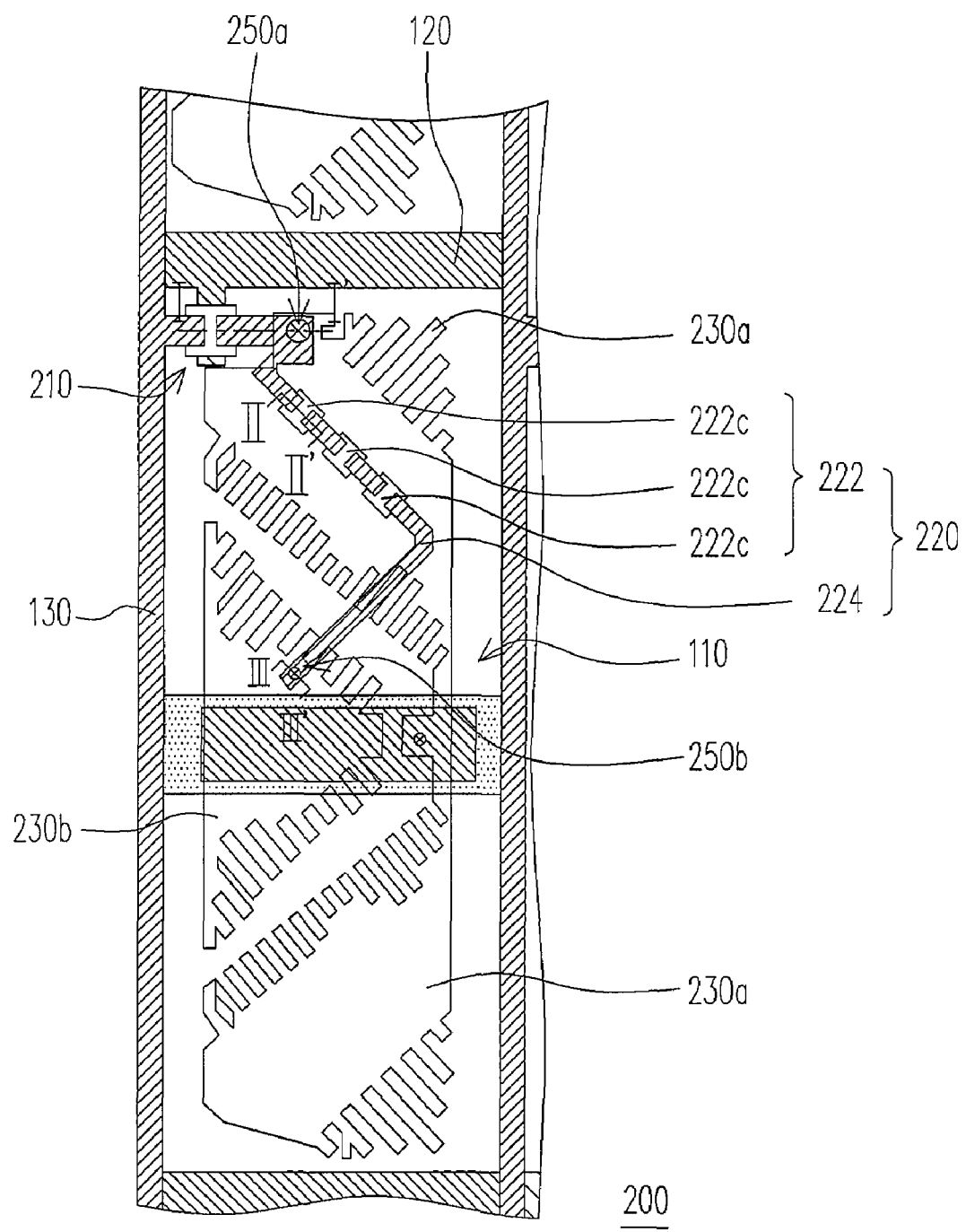
FIG. 1 is a top view of a pixel structure according to the preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
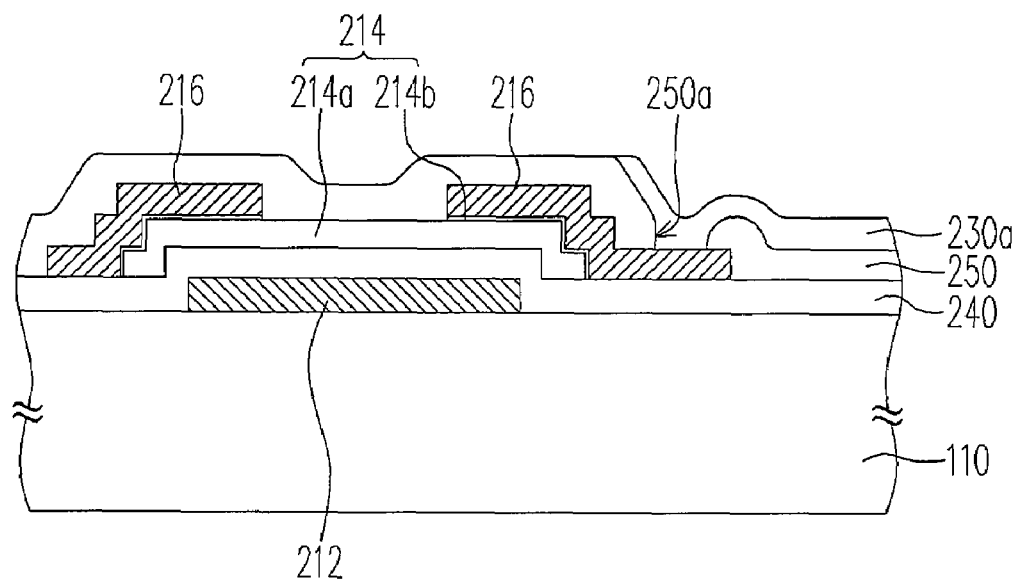
FIGS. 2A-2C are cross sectional views when viewing along lines I-I', II-II' and III-III' in FIG. 1 respectively.
Figure 2B:
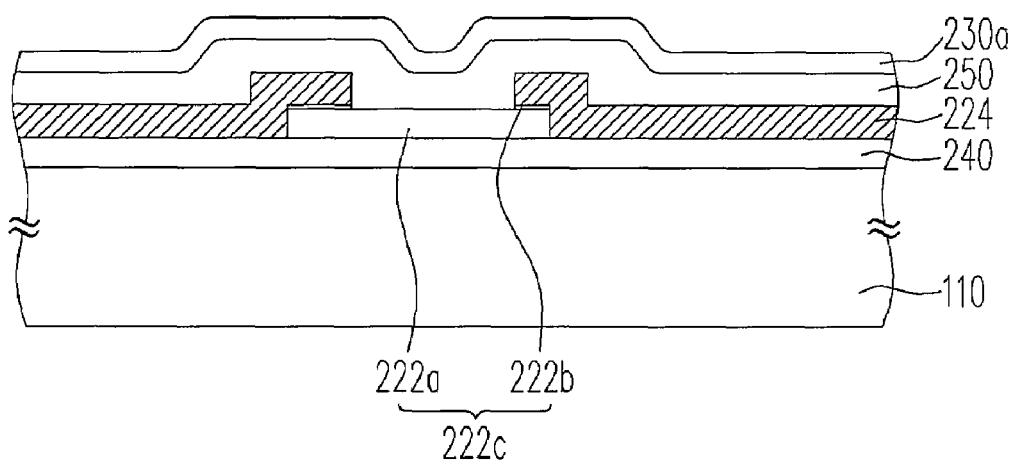
Figure 2C:
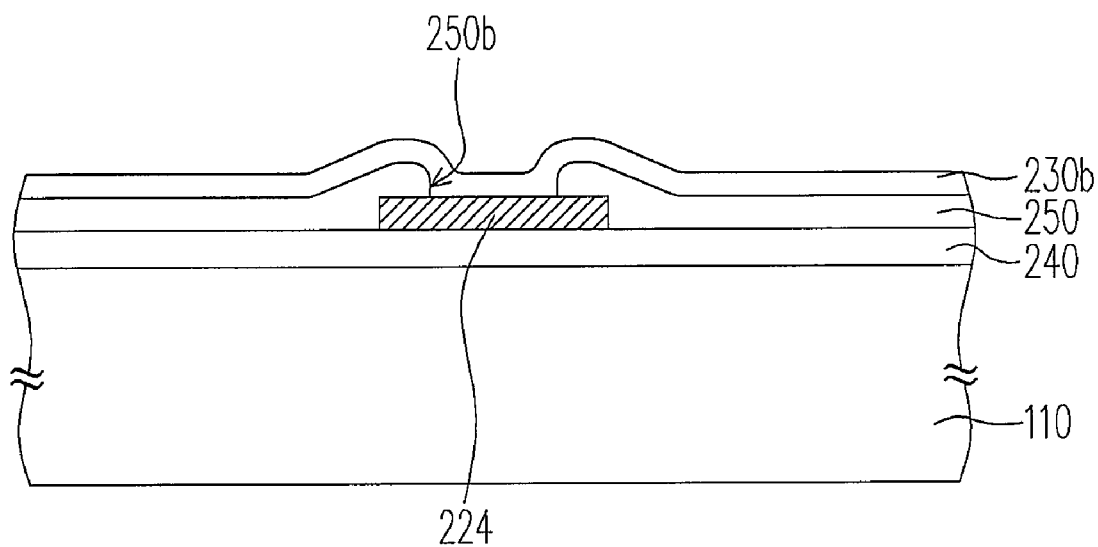

FIG. 1 is a top view of a pixel structure according to the preferred embodiment of the invention and FIGS. 2A-2C are cross sectional views when viewing along lines I-I', II-II' and III-III' in FIG. 1 respectively. Referring to FIG. 1, a pixel structure 200 of one embodiment is appropriately employed on a thin film transistor array substrate of MVA LCDs and the pixel structure 200 is controlled by a scan line 120 and a data line 130 disposed on a substrate 110, wherein the substrate 110 may be, for example, a quartz substrate, a glass substrate and other transparent substrates. In addition, a material of the scan line 120 and the data line 130 may be, for example, chromium (Cr) or other metal material.

The pixel structure 200 comprises a thin film transistor 210, a resistance wire 220, a first pixel electrode 230a and a second pixel electrode 230b, wherein the thin film transistor 210 is disposed on the substrate 110 and connected to the scan line 120 and the data line 130, respectively. In addition, the resistance wire 220, the first pixel electrode 230a and the second pixel electrode 230b are disposed on the substrate 110, wherein the first pixel electrode 230a and the second pixel electrode 230b are separated from each other. The material of the first pixel electrode 230a and the second pixel electrode 230b may be, for example, indium tin oxide (ITO), indium zinc oxide (IZO) or other transparent conducting material. It should be noted that a plurality of slits (shown in FIG. 1) are formed at edges of the first pixel electrode 230a and the second pixel electrode 230b. However, the slits may be replaced by protrusions formed on the first pixel electrode 230a and the second pixel electrode 230b.

It is noted that the first pixel electrode 230a is electrically connected to the thin film transistor 210 while the second pixel electrode 230b is electrically connected to the thin film transistor 210 through the resistance wire 220. In another embodiment, the position of the resistance wire 220 corresponds to that of the alignment protrusion (not shown) while the alignment protrusion may be, for example, disposed on a colour filter substrate, a thin film transistor substrate or both so that the effect of resistance wire 220 to the opening rate can be lowered to a minimal. In addition, the invention is not limited to the thin film transistor 210 electrically coupled to the scan line 120 and the data line 130. Other active devices with three terminals may replace the thin film transistor 210 of the invention.

To describe the invention in more detail, refer to FIG. 1 and FIG. 2A. The thin film transistor 210 comprises a gate electrode 212, a first dielectric layer 240, a first semiconductor layer 214, a source/drain 216 and a second dielectric layer 250, wherein the gate electrode 212 is electrically coupled to the scan line 120. In addition, the first dielectric layer 240 is disposed over the gate electrode 212 and the first semiconductor layer 214 is deposited over the first dielectric layer 240 covering the gate electrode 212, for example.

The source/drain 216 is deposited on the first semiconductor layer 214, wherein one of the source/drain 216 is electrically coupled to the data line 130 while another of the source/drain 216 is electrically connected to the resistance wire 220 and the first pixel electrode 230a, respectively. Furthermore, the second dielectric layer 250 has a first contact hole 250a, wherein the first pixel electrode 230a is electrically connected to one of the source/drain 216 through the first contact hole 250a. It is noted that the structure of the thin film transistor 210 is not limited to one shown in FIG. 1 and FIG. 2A but may be other types of thin film transistors.

Refer to FIG. 1, FIG. 2B and FIG. 2C. The resistance wire 220 comprises a second semiconductor layer 222 and a patterned conductor layer 224, wherein the second semiconductor layer 222 electrically connects to one of source/drain 16 and the second pixel electrode 230b through the patterned conductor layer 224. For example, the second dielectric layer 250 has a second contact hole 250b, wherein the second pixel electrode 230b is electrically connected to the resistance line 220 through the patterned conductor layer 224 and the second contact hole 250b. In addition, the first semiconductor layer and the second semiconductor layer are comprised of substantially the same material and the second semiconductor layer 222 may be, for example, a channel layer 222a and an ohmic contact layer disposed on the channel layer 222.

In particular, the resistance wire 220 may have different resistance values by varying the length, the thickness or both of the second semiconductor layers 222. In this embodiment, the thickness of the second semiconductor layer 222 is equal to that of the first semiconductor layer 214 while in another embodiment, the thickness of the second semiconductor layer 222 may be lesser than that of the first semiconductor layer 214. In addition, the second semiconductor layer 222 may be disposed on the second dielectric layer 240 in a multi-segment arrangement and further comprises a plurality of island patterns 222c, wherein these island patterns 222c are electrically connected through the patterned conductor layer 224. In other words, these island patterns 222c and the patterned conductor layer 224 are interleaved and disposed on the second dielectric layer 240. Moreover, the thickness of these island patterns 222c may also be lesser than or equal to that of the first semiconductor layer 214.

When voltage of the scan line 120 is input to the first pixel electrode 230a and the second pixel electrode 230b via the thin film transistor 210, respectively, voltage of the second pixel electrode 230b is lesser than that of the first pixel electrode 230a because the resistance wire 220 will cause a voltage drop. In other words, transmittances caused by different voltages of the first pixel electrode 230a and the second pixel electrode 230b will also be different. Accordingly, the adjustment of the voltages of first pixel electrode 160a and the second pixel electrode 160b will cause a user less likely to observe the brightness variation from different viewing angles. Since the transmittance does not significantly vary under different the viewing angle, MVA LCDs employing this pixel structures 200 will attain an optimal display effect.

Refer to FIG. 1. The method for manufacturing the pixel structures 200 comprises the following steps. First, the gate electrode 212 connected to a scan line 120 is formed on the substrate 110, wherein the process of forming the gate electrode 212 may comprises, for example, forming a conductive layer (not shown) on the substrate 110 by a sputtering method and then patterning the conductive layer. Thereafter, a first dielectric layer 240 covering the data line 120 and the gate electrode 212 is formed on the substrate 110, as shown in FIG. 2A.

Refer to FIG. 2A to FIG. 2C. The first semiconductor layer 214 and the second semiconductor layer 222 are formed on the first dielectric layer, wherein the step of forming the first semiconductor layer 214 and the second semiconductor layer 222 may comprise, for example, forming the channel layer (not shown) and the ohmic contact layer (not shown), and then patterning these two layers. It is noted that since the first semiconductor layer 214 and the second semiconductor layer 222 are fabricated in the same process, no extra process is needed to form the second semiconductor layer 222. In addition, a plurality of island patterns 222c are formed during the step of forming the second semiconductor layer 222.

Subsequently, the source/drain 216 and the patterned conductor layer 224 are formed on the substrate 110, wherein one of the source/drain is connected to the data line 130, while another of source/drain 216 is electrically connected to the second semiconductor layer 222 through the patterned conductor layer 224. Moreover, the step of forming the source/drain 216 and the patterned conductor layer 224 includes forming the conductive layer on the first dielectric layer 240 and then patterning the conductive layer to form the resistance wire 220. If a plurality of island patterns 222c are formed during the step of forming the second semiconductor layer 222, these island patterns 222c are electrically connected one another through the patterned conductor layer 224. It is noted that the process of patterning patterned conductor layer can be controlled to remove a partial thickness of the second semiconductor layer 222 such that its thickness is less than that of the first semiconductor layer 214.

Thereafter, the second dielectric layer 250 is formed on the substrate 110 to cover the data line 130, the resistance wire 220 and the source/drain 216. The step of forming the second dielectric layer 250 comprises forming the first contact hole 250a and the second contact hole 250b, wherein the first contact hole 250a exposes partially a surface of the source/drain 216 while the second contact hole 250b exposes partially a surface of the patterned conductor layer 224.

The first pixel electrode 230a and the second pixel electrode 230b are formed on the second dielectric layer 250, wherein these two pixel electrodes are separated from each other. In addition, the first pixel electrode 230a is electrically connected to one of the source/drain 216 through the first contact hole 250a while the second pixel electrode 230b is connected to another of the source/drain 216 through the resistance wire 220.

The second semiconductor layer 222 of the resistance wire 220 and the first semiconductor 214 of the thin film transistor 210 are formed at the same time. In addition, the source/drain 216 of the thin film transistor 210 and the patterned conductor layer 224 of the resistance wire 220 are formed at the same time. Besides, the first contact hole 250a and the second contact hole 250b are also formed at the same time. From the above description, since the step of forming resistance wire 220 can be integrated into the step of forming the thin film transistor 210, the first pixel electrode 230a and the second pixel electrode 230b, the method of manufacturing pixel structures of the invention can form pixel electrodes with different voltages in a single pixel structure without an extra mask to improve the display quality of MVA LCDs employing this pixel structure 200.

In conclusion, the pixel structure and the manufacturing method thereof of the invention provide the following advantages.

1. In contrast to the prior art, the pixel structures of the invention have the first pixel electrode and the second pixel electrode separated from each other and the second pixel electrode is electrically connected to the thin film transistor through the resistance wire. Therefore, the first pixel electrode and the second pixel electrode have different voltages to improve brightness variation and colour shift caused by viewing angle variation.

2. In the pixel structures of the invention, the resistance wire with different resistance values can be obtained not only by varying the length, the width or the thickness etc. in the geometric dimension of the second semiconductor layer of the resistance wire. It can be also obtained by segregating the second semiconductor layer into a plurality of segments, thereby adjusting the voltage difference of the first pixel electrode and the second pixel electrode.

3. In contrast to the prior art, the method of manufacturing pixel structures of the invention can form the resistance wire without an extra mask. Therefore, the manufacturing method of pixel structures of the invention not only increasing the manufacturing cost but form pixel electrodes with different voltages in a single pixel structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a pixel structure controlled by a data line and a scan line, comprising:

providing a substrate; forming a gate electrode electrically connected to the scan line on the substrate;

forming a first dielectric layer on the substrate to cover the scan line and the gate electrode;

forming a first semiconductor layer and a second semiconductor layer on the first dielectric layer;

forming a source/drain and a patterned conductor layer on the substrate, wherein one of the source/drain is electrically coupled to the data line while the other of the source/drain is electrically coupled to the second semiconductor layer through the patterned conductor layer;

forming a second dielectric layer on the substrate to cover the scan line, a resistance wire and the source/drain;

forming a first pixel electrode and a second pixel electrode on the second dielectric layer, wherein the first and the second pixel electrodes are separated from each other and the first pixel electrode is electrically connected to the one of the source/drain while the second pixel electrode is electrically connected to the other of the source/drain through the resistance wire.

2. The method according to claim 1, wherein the step of forming the source/drain further comprises removing at least a portion of the second semiconductor layer.

3. The method according to claim 1, wherein the step of forming the second semiconductor layer comprises forming at least one island pattern.

4. The method according to claim 3, wherein the step of forming the data line further comprises removing at least a portion of the island pattern.

5. The method according to claim 1, further comprising the step of forming a first contact hole in the second dielectric layer, wherein the first contact hole exposes partially a surface of the source/drain and after the first and the second pixel electrodes are formed on the second dielectric layer, the first pixel electrode is connected to the source/drain through the first contact hole.

6. The method according to claim 1, further comprising the step of forming a second contact hole in the second dielectric layer, wherein the second contact hole exposes partially a surface of the patterned conductor layer.

7. The method according to claim 1, wherein the step of forming the semiconductor layer comprises:

forming a channel layer on the first dielectric layer; and forming an ohmic contact layer on the channel layer.

\* \* \* \* \*